United States Patent
Teterwak et al.

(10) Patent No.: US 9,369,141 B2
(45) Date of Patent: Jun. 14, 2016

(54) INTERCONNECT STRUCTURES FOR MINIMIZING CLOCK AND OUTPUT TIMING SKEWS IN A HIGH SPEED CURRENT STEERING DAC

(71) Applicant: Maxim Integrated Products, Inc., San Jose, CA (US)

(72) Inventors: Jerzy Teterwak, Colorado Springs, CO (US); Dan McMahill, Woodstock, GA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/986,993

(22) Filed: Jan. 4, 2016

(65) Prior Publication Data

US 2016/0118994 A1 Apr. 28, 2016

Related U.S. Application Data

(63) Continuation of application No. 14/593,697, filed on Jan. 9, 2015, now Pat. No. 9,231,607.

(60) Provisional application No. 61/944,859, filed on Feb. 26, 2014.

(51) Int. Cl.

| H03M 1/06 | (2006.01) |
|---|---|
| H03M 1/74 | (2006.01) |
| H03K 19/0175 | (2006.01) |
| H03M 1/00 | (2006.01) |
| H03M 1/12 | (2006.01) |
| H03M 1/66 | (2006.01) |

(52) U.S. Cl.
CPC ...... *H03M 1/0624* (2013.01); *H03K 19/017545* (2013.01); *H03M 1/74* (2013.01); *H03M 1/00* (2013.01); *H03M 1/12* (2013.01); *H03M 1/66* (2013.01); *H03M 1/747* (2013.01)

(58) Field of Classification Search
CPC .......... H03M 1/747; H03M 1/00; H03M 1/12
USPC ................. 341/118, 144, 145, 136, 119, 120
See application file for complete search history.

(56) References Cited

U.S. PATENT DOCUMENTS

| 6,329,940 B1 * | 12/2001 | Dedic ................. H03M 1/0827 341/144 |
|---|---|---|
| 2015/0244384 A1 | 8/2015 | Teterwak et al. |

* cited by examiner

*Primary Examiner* — Joseph Lauture

(57) ABSTRACT

A system includes a clock interconnect network having an input node and a plurality of output nodes. The clock interconnect network receives a clock input at the input node and distributes, based on the clock input, a plurality of clock signals via respective ones of the plurality of output nodes. A propagation delay of each of the plurality of clock signals distributed by the clock interconnect network is approximately equal to respective propagation delays of others of the plurality of clock signals distributed by the clock interconnect network. A digital-to-analog converter includes a plurality of segments, each outputting a respective output, and a plurality of drivers. Each of the plurality of drivers receives a respective one of the plurality of clock signals and provides a driver signal to a respective one of the plurality of segments based on the respective one of the plurality of clock signals.

20 Claims, 8 Drawing Sheets

INTERCONNECT STRUCTURES FOR MINIMIZING CLOCK AND OUTPUT TIMING SKEWS IN A HIGH SPEED CURRENT STEERING DAC

CROSS-REFERENCE TO RELATED APPLICATIONS

This application is a continuation of U.S. patent application Ser. No. 14/593,697, filed Jan. 9, 2015, which claims the benefit of U.S. Provisional Application No. 61/944,859, filed on Feb. 26, 2014. The disclosures of the above applications are incorporated herein by reference in their entirety.

FIELD

The present disclosure relates to minimizing timing skew in high speed current steering digital-to-analog converters.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Various systems, including, but not limited to, communications systems, implement high speed current steering digital-to-analog converters (DACs). In some communications systems, it is desirable for DAC output signals to have a high spurious free dynamic range (SFDR).

Referring now to FIG. 1, an example DAC 100 includes a plurality of segments 104-1 . . . 104-n, referred to collectively as segments 104. Each of the segments 104 includes a respective set of differential segment switches 108-1, 108-2 . . . 108-p, 108-q, referred to collectively as segment switches 108. In other words, each of the segments 104 includes a pair of differential segment switches (e.g., a pair of transistors). The segment switches 108 steer output currents of the DAC 100 to respective positive outputs 112 and negative outputs 116 of the DAC 100. For example, the DAC 100 may include $2^N-1$ of the segment switches 108, where N corresponds to a resolution, in bits, of the DAC 100. In some implementations, a number of the segments 104 may be limited to, for example, 32 or 64 and a resolution of the DAC 100 may be increased by adding additional segmented or binary-weighted sub-DACs.

Each of the segment switches 108 is driven by respective driver signals 120-1, 120-2 . . . 120-p, 120-q, referred to collectively as driver signals 120, received from segment switch drivers 124-1 . . . 124-n, referred to collectively as segment switch drivers 124. The segment switch drivers 124 generate the driver signals 120 based on a clock signal 128 and decoder output data 132-1 . . . 132-n, referred to collectively as decoder output data 132. For example only, the decoder output data 132 is output by a binary to thermometer code decoder (not shown). Current source segments 136-1 . . . 136-n, referred to collectively as current source segments 136, provide currents to the respective segments 104.

Accordingly, the decoder output data 132, which corresponds to a digital input code to be converted to an analog output, is retimed by the clock signal 128 prior to being applied to the segment switches 108 via the driver signals 120. As the input code increases, less current is directed to the negative outputs 116 while more current is directed to the positive outputs 112. For differential mode operation, a resulting output current of the DAC 100 corresponds to a difference between respective currents of the positive outputs 112 and the negative outputs 116. The differential output operation suppresses even order harmonics and increases output signal power of the DAC 100.

SUMMARY

A digital-to-analog converter (DAC) system includes a DAC and a clock interconnect module. The DAC includes a plurality of segments and a plurality of drivers. Each of the plurality of segments receives driver signals from a respective one of the plurality of drivers and generates a positive output and a negative output based on the driver signals. Each of the plurality of drivers receives a respective one of a plurality of clock signals and outputs the driver signals based on the respective one of the plurality of clock signals. The clock interconnect module includes an interconnect loop. A clock input is connected to a first portion of the interconnect loop and the plurality of clock signals are output from a second portion of the interconnect loop connected to the plurality of drivers.

A method of operating a digital-to-analog converter (DAC) includes receiving a clock input at a first portion of an interconnect loop, outputting a plurality of clock signals from a second portion of the interconnect loop, outputting a plurality of driver signals based on respective ones of the plurality of clock signals, and generating, based on the plurality of driver signals, a positive output and a negative output from each of a plurality of segments of the DAC.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In a digital-to-analog converter (DAC) system (such as a DAC system implementing a high speed current steering DAC), it may be desirable for output signals of the DAC to have a high spurious free dynamic range (SFDR). Timing skew between segments of the DAC may limit the SFDR of the DAC. For example, the timing skew may cause segment current transitions to appear at outputs of the DAC at different time instances. Depending on a profile of the timing skew (e.g., linear, parabolic, random, etc.), the resulting output signal of the DAC may have distortion in a form of, for example only, $2^{nd}$, $3^{rd}$ other multiple higher-order harmonics, etc.

The timing skew may be caused by, for example, timing mismatches in a clock interconnect network and/or an output interconnect network. In a DAC operating with a multi-GHz update rate and synthesizing a GHz range RF signal, timing mismatches as small as a fraction of a picosecond can cause unacceptable distortions of the output signal of the DAC. In some implementations, a matched binary tree structure may be used to match respective delays in the clock interconnect network and the output interconnect network of the DAC. However, matched binary tree structures are not sufficient to minimize the timing skew at multi-GHz frequencies due to interactions between branches of the matched binary tree structure.

A DAC system according to the principles of the present disclosure uses phase interpolation to minimize timing errors of a DAC clock and outputs signals, thereby minimizing timing skew associated with the DAC clock and output signals. For example, a phase of two waves propagating through two sides of a loop transmission line of the DAC is interpolated to generate a signal having a spatially constant phase. Accordingly, the DAC system according to the principles of the present disclosure includes a clock interconnect module and an output interconnect module to minimize the timing skew.

Figure 1:
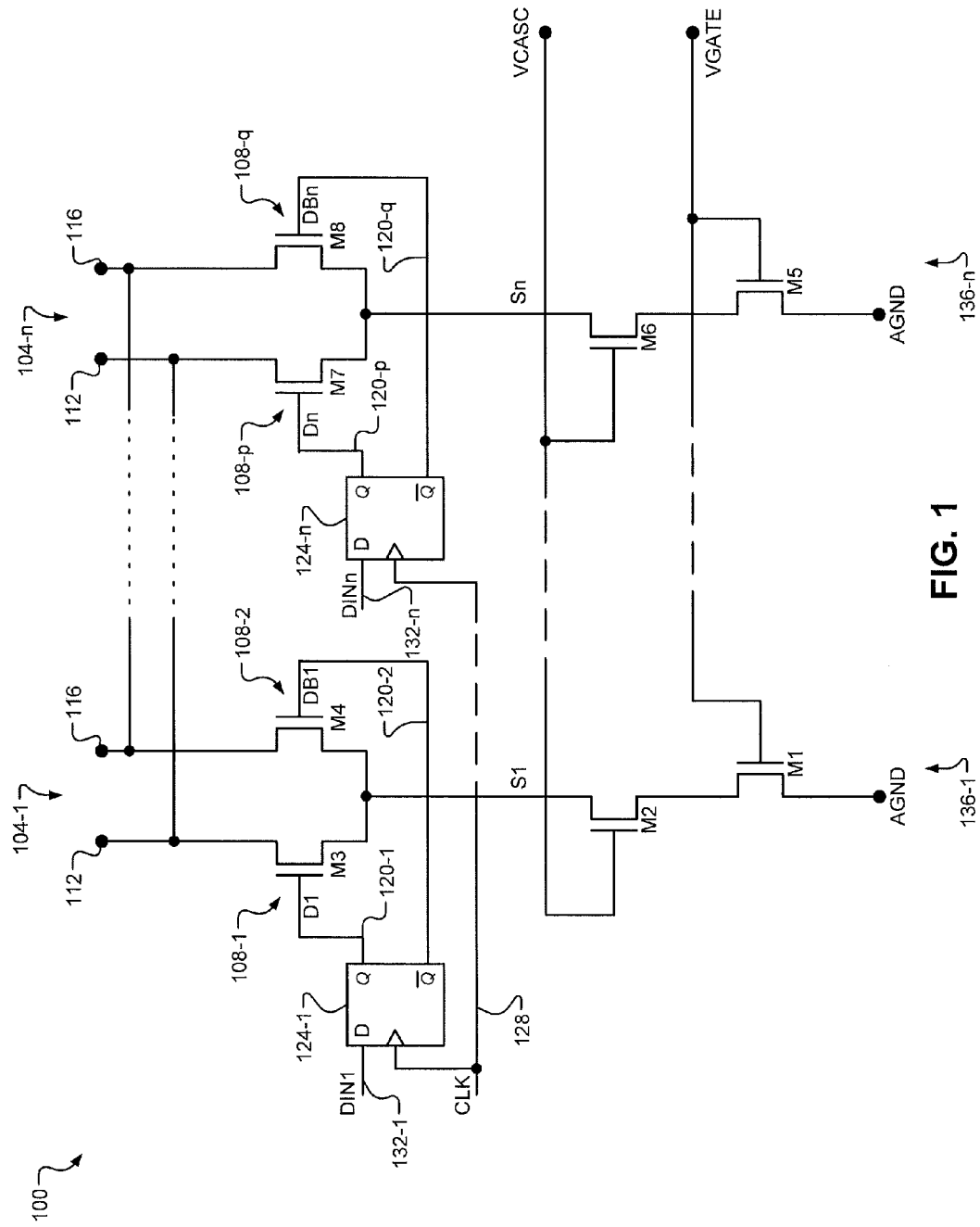
FIG. 1 is an example DAC according to the prior art.
Figure 2:
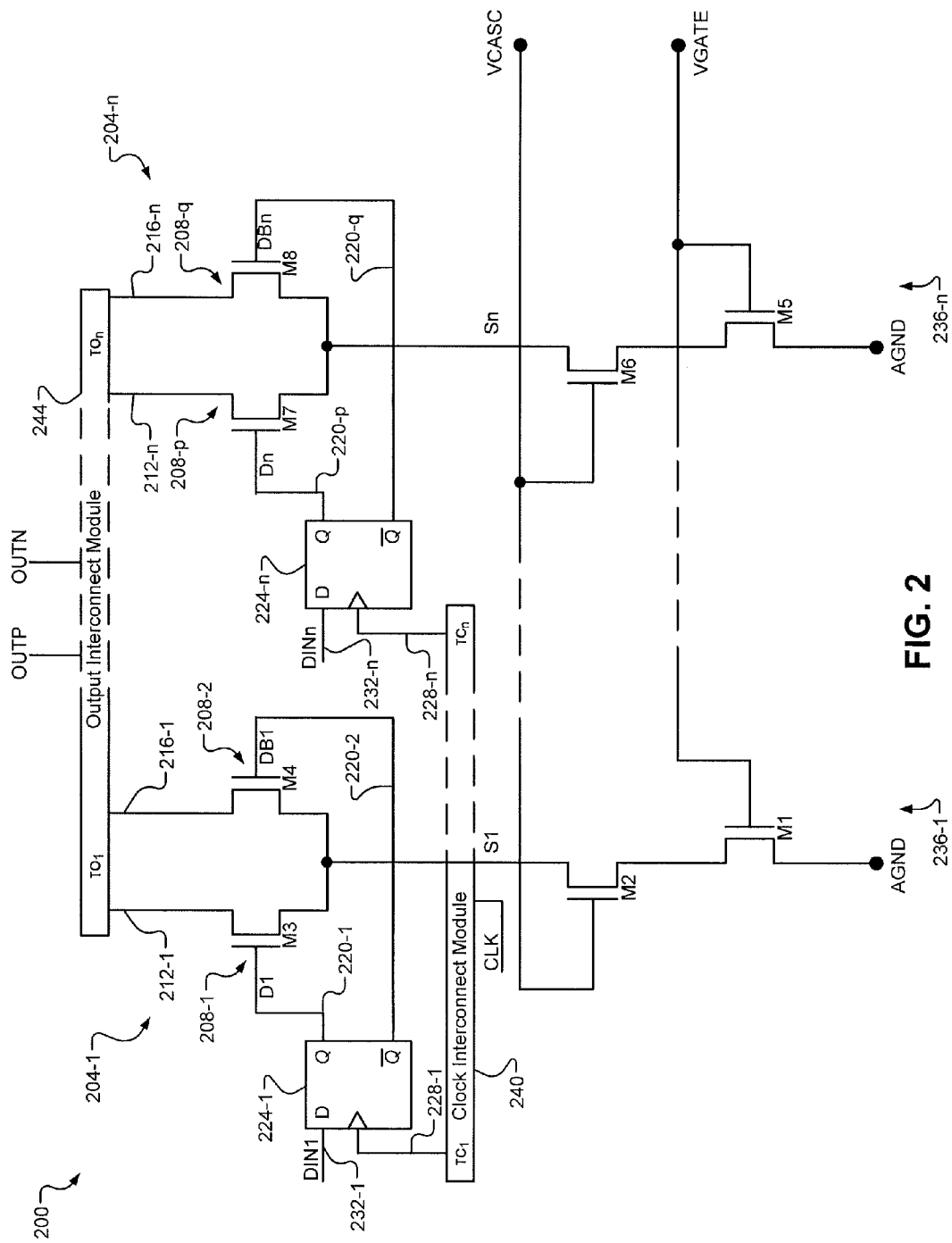
FIG. 2 is an example DAC including a clock interconnect module and an output interconnect module according to the principles of the present disclosure.

Referring now to FIG. 2, an example DAC 200 includes a plurality of segments 204-1 . . . 204-n, referred to collectively as segments 204. Each of the segments 204 includes a respective set (i.e., a pair) of differential segment switches 208-1, 208-2 . . . 208-p, 208-q, referred to collectively as segment switches 208. The segment switches 208 steer output currents of the DAC 200 to respective positive outputs 212-1 . . . 212-n, referred to collectively as positive outputs 212, and negative outputs 216-1 . . . 216-n, referred to collectively as negative outputs 216 of the DAC 200.

Each of the segment switches 208 is driven by respective driver signals 220-1, 220-2 . . . 220-p, 220-q, referred to collectively as driver signals 220, received from segment switch drivers 224-1 . . . 224-n, referred to collectively as segment switch drivers 224. The segment switch drivers 224 generate the driver signals 220 based on clock signals 228-1 . . . 228-n, referred to collectively as clock signals 228, and decoder output data 232-1 . . . 232-n, referred to collectively as decoder output data 232. Current source segments 236-1 . . . 236-n, referred to collectively as current source segments 236, provide currents to the respective segments 204.

The DAC 200 includes a clock interconnect module 240 and an output interconnect module 244, which implement a clock interconnect network and an output interconnect network, respectively, according to the principles of the present disclosure.

Figure 3:
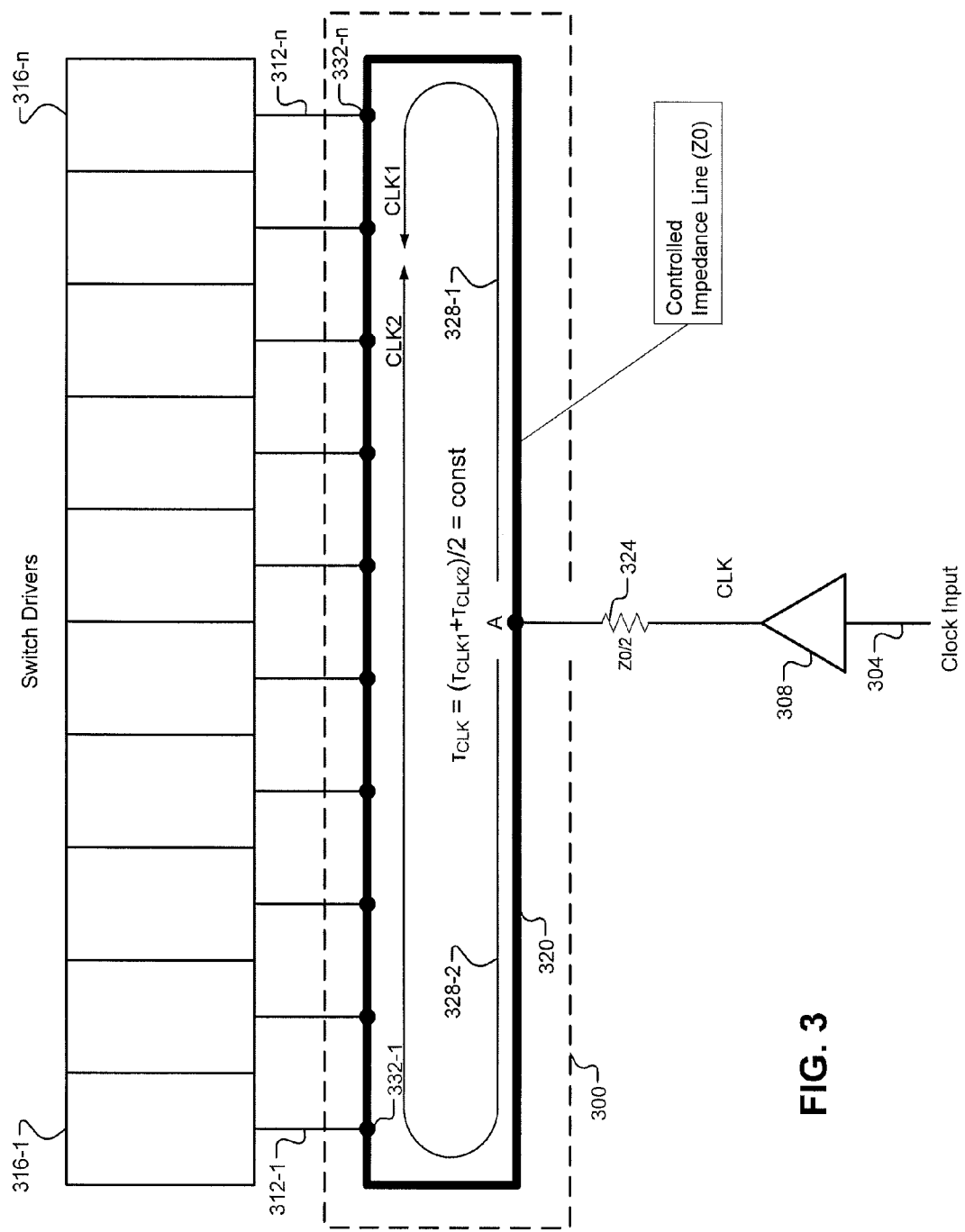
FIG. 3 is an example clock interconnect module according to the principles of the present disclosure.

Referring now to FIG. 3, an example clock interconnect module 300 according to the principles of the present disclosure receives a clock input 304 (e.g., via buffer 308) and outputs a plurality of clock signals 312-1 . . . 312-n, referred to collectively as clock signals 312, accordingly. The clock signals 312 are received by respective segment switch drivers 316-1 . . . 316-n, referred to collectively as segment switch drivers 316.

The clock interconnect module 300 includes a controlled impedance interconnect loop 320. For example, the controlled impedance interconnect loop 320 includes a loop-shaped controlled impedance line having an impedance of Z0. The controlled impedance interconnect loop 320 distributes the clock signals 312 to the segment switch drivers 316. The controlled impedance interconnect loop 320 receives the clock input 304 through a matched impedance 324. For example, the matched impedance 324 corresponds to an impedance of Z0/2.

In this manner, the clock input 304 is connected to a bottom portion of the controlled impedance interconnect loop 320 while the clock signals 328 are connected to a top portion of the controlled impedance interconnect loop 320. In particular, the clock input 304 is connected to a node A on the bottom portion of the controlled impedance interconnect loop 320, causing clock signals 328-1 and 328-2, referred to collectively as clock signals 328, to propagate in opposite directions from the node A around the controlled impedance interconnect loop 320. Accordingly, each of the clock signals 312 corresponds to a superposition (i.e., overlap) of the clock signals 328, received from opposite directions, at a different point (332-1 . . . 332-n, referred to collectively as points 332) on the top portion of the controlled impedance interconnect loop 320.

An average propagation delay of respective waves of the clock signals 328-1 and 328-2 is independent of a respective position along the controlled impedance interconnect loop 320 (i.e., the positions corresponding to the points 332) and is approximately equal to half of a propagation delay of the entire controlled impedance interconnect loop 320. For example, a delay $\tau_{clk}$ of each of the clock signals 312 can be calculated according to $\tau_{clk}=(\tau_{clk1}+\tau_{clk2})/2=$const, where $\tau_{clk1}$ corresponds to a delay of the clock signal 328-1, $\tau_{clk2}$ corresponds to a delay of the clock signal 328-2, and const is a constant. In other words, respective delays of the clock signals 312 provided to each of the segment switch drivers 316 is a same constant. In this manner, the resulting clock signals 328 provided to the segment switch drivers 316 each have a same associated propagation delay independent of positions of respective segment switches associated with the segment switch drivers 316.

Figure 4:
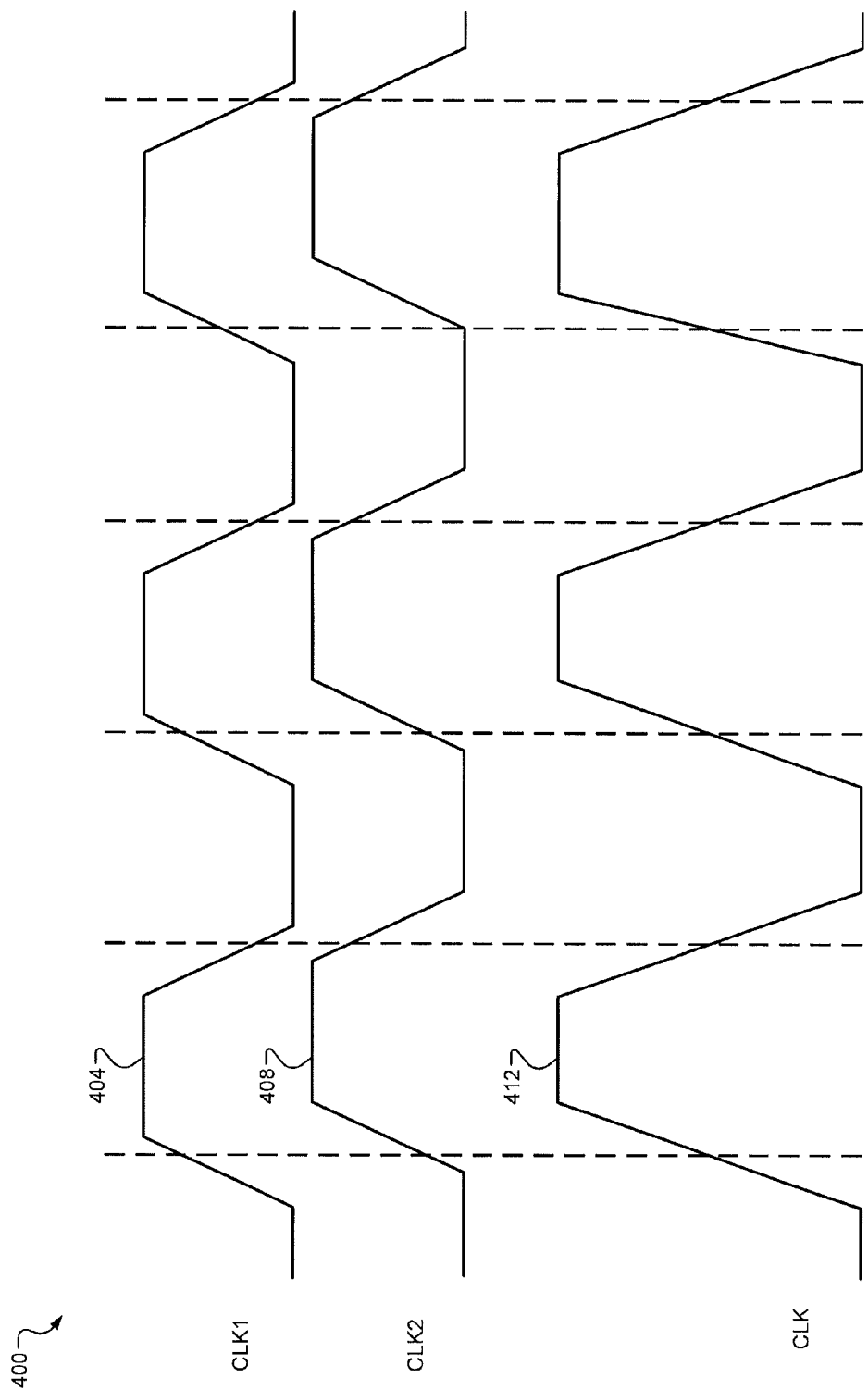
FIG. 4 illustrates an example clock phase interpolation according to the principles of the present disclosure.

Referring now to FIG. 4, an example phase interpolation 400 of a clock signal 404 (e.g., corresponding to the clock signal 328-1) and a clock signal 408 (e.g., corresponding to the clock signal 328-2) is shown. Although pulses of the clock signals 404 and 408 have different phases (i.e., due to propagation delays of the respective clock signals 404 and 408), when the clock signals 404 and 408 are added together (i.e., as received at respective ones of the points 332 on the top portion of the impedance loop 320), a propagation delay of the resulting clock signal 412 is the same for each of the clock signals 312.

Figure 5:
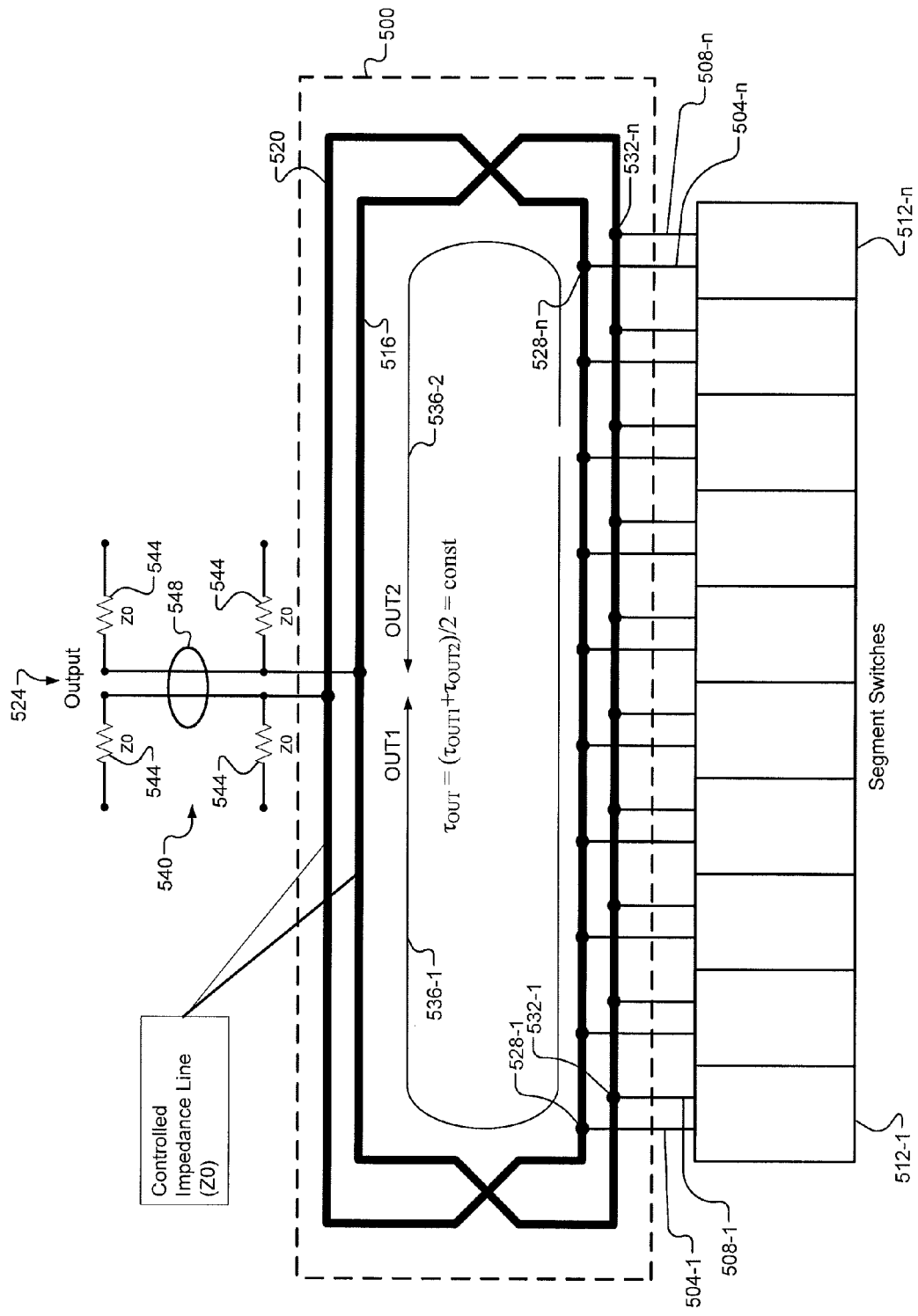
FIG. 5 is an example output interconnect module according to the principles of the present disclosure.

Referring now to FIG. 5, an example output interconnect module 500 according to the principles of the present disclosure receives positive outputs 504-1 . . . 504-n, referred to collectively as positive outputs, 504 and negative outputs 508-1 . . . 508-n, referred to collectively as positive outputs 508, from respective sets of segment switches 512-1 . . . 512-n, referred to collectively as segment switches 512. The output interconnect module 500 includes one or more transmission loops, such as transmission loops 516 and 520. The transmission loops 516 and 520 may each include a corresponding controlled impedance line (e.g., having an impedance of Z0). Because a DAC output signal 524 is differential, the transmission loops include the two crossed-over transmission loops 516 and 520. The transmission loops 516 and 520 are crossed over as shown to maintain symmetry of the positive and negative DAC outputs of the output signal 524. However, in some implementations, it is anticipated that the transmission loops 516 and 520 may not necessarily be crossed over, or only a single transmission loop may be used.

Each of the positive outputs 504 propagates in both directions from a respective one of points 528-1 . . . 528-n, referred to collectively as the points 528, on the transmission loop 516. Similarly, each of the negative outputs 508 propagates in both directions from a respective one of points 532-1 . . . 532-n, referred to collectively as the points 532, on the transmission loop 516. (e.g., as positive output signals 532-1 and 532-2). Output signals propagating in opposite directions around the transmission loops 516 and 520 are represented schematically for both the positive outputs 504 and negative outputs 508 as output signals 536-1 and 536-2, referred to collectively as output signals 536. A delay $\tau_{OUT}$ of each of the positive and negative components of the output signal 524 can be calculated according to $\tau_{OUT}=(\tau_{OUT1}+\tau_{OUT2})/2=\text{const}$, where $\tau_{OUT1}$ corresponds to a delay of the output signal 536-1, $\tau_{OUT2}$ corresponds to a delay of the output signal 536-2, and const is a constant. In other words, respective delays of the output signals 536 provided as the positive and negative components of the output signal 524 are a same constant. An output circuit 540 including matched impedances (e.g., each having an impedance of Z0) 544 provides the DAC output signal 524 via external output transmission lines 548.

Figure 6:
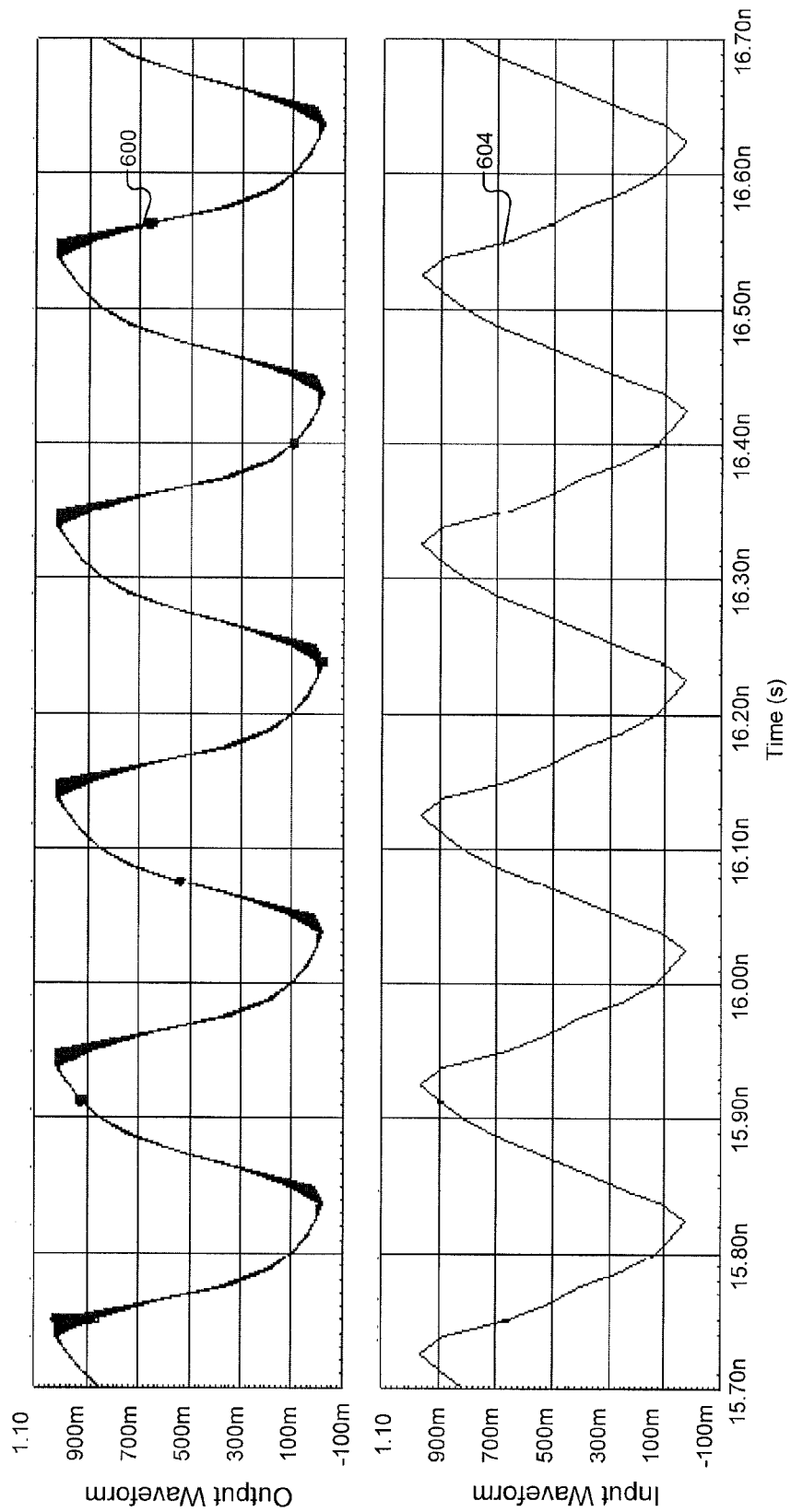
FIG. 6 illustrates example waveforms at inputs and outputs of a clock interconnect module according to the principles of the present disclosure.

Referring now to FIG. 6, an example output waveform (e.g., corresponding to each of the clock signals 312 output from the clock interconnect module 300) 600 resulting from an input waveform (e.g., corresponding to the clock input 304 received by the clock interconnect module 300) 604 is shown. As shown, although clock edges of the output waveform 600 may have slightly different rise times, each of the individual pulses of the output waveform crosses at a same midpoint.

Figure 7:
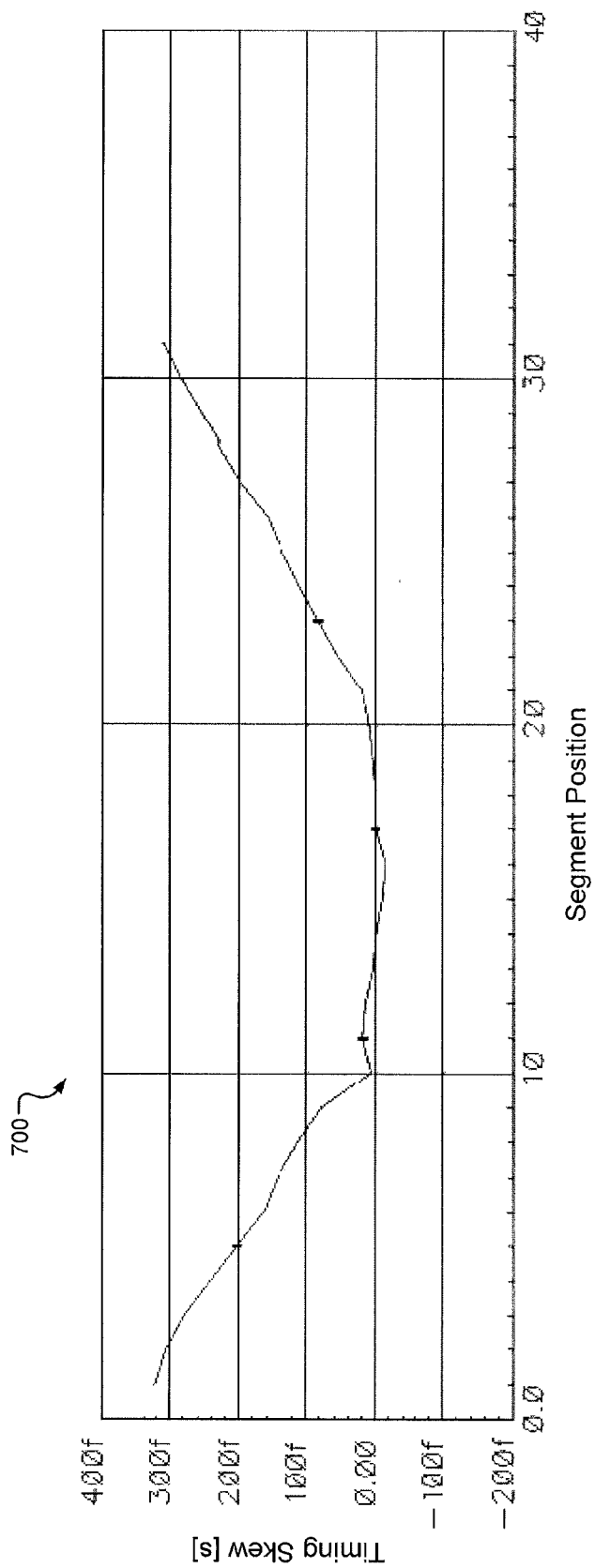
FIG. 7 illustrates an example segment timing skew vs. segment position according to the principles of the present disclosure.

Referring now to FIG. 7, an example timing skew 700 for various segment positions is shown.

Figure 8:
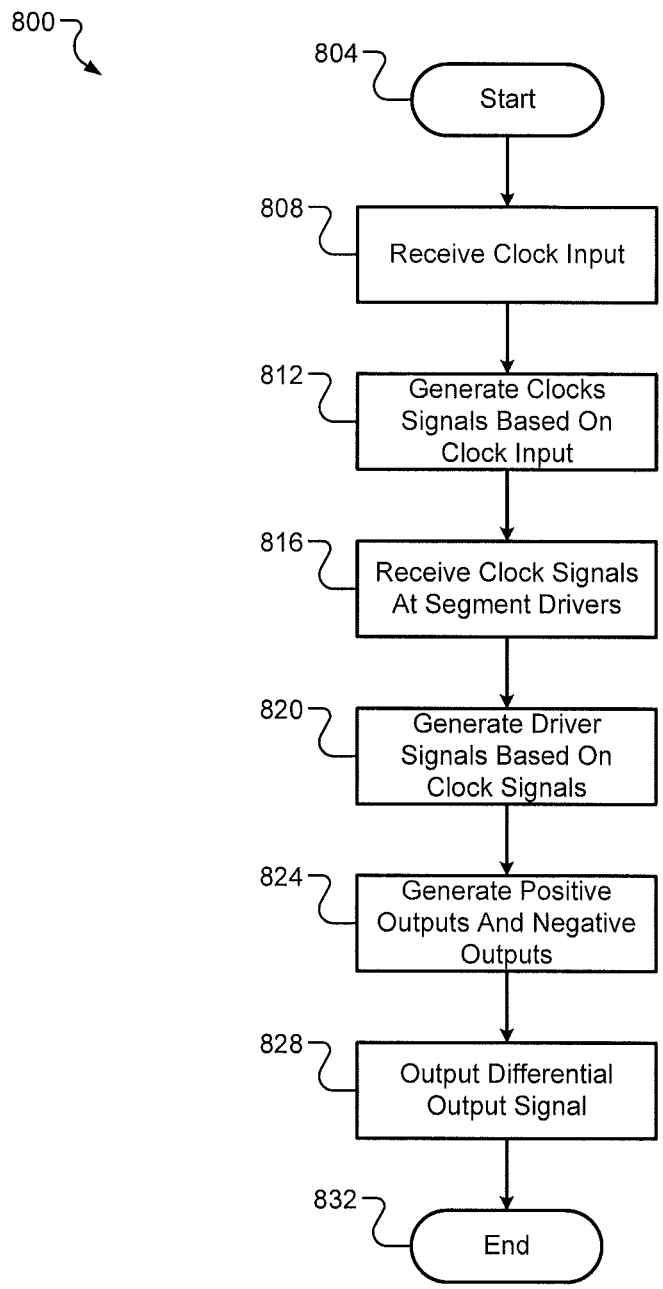
FIG. 8 illustrates steps of an example method of operating a DAC according to the principles of the present disclosure.

Referring now to FIG. 8, an example method 800 of operating a DAC according to the principles of the present disclosure begins at 804. At 808, a clock input is received. For example, the clock input is connected to a first portion (e.g., a bottom portion, as shown in FIG. 3) of an impedance loop. At 812, a plurality of clock signals is generated based on the clock input. For example, the clock input propagates in opposite directions around the impedance loop to be output, as the plurality of clock signals, from respective nodes on a second portion (e.g., a top portion) of the impedance loop. At 816, the plurality of clock signals is received by respective segment drivers. At 820, the segment drivers generate a plurality of driver signals based on the plurality of clock signals. At 824, positive outputs and negative outputs are generated based on the driver signals. At 828, a differential output signal is output based on the positive outputs and the negative outputs. For example, the positive outputs and the negative outputs are connected to one or more transmission loops. Each of the positive outputs and the negative outputs propagate in opposite directions around the transmission loop to be output as the differential output signal. The method 800 ends at 832.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A system comprising:
a clock interconnect network including an input node and a plurality of output nodes, wherein the clock interconnect network receives a clock input at the input node and distributes, based on the clock input, a plurality of clock signals via respective ones of the plurality of output nodes, and wherein a propagation delay of each of the plurality of clock signals distributed by the clock interconnect network is approximately equal to respective propagation delays of others of the plurality of clock signals distributed by the clock interconnect network; and
a digital-to-analog converter (DAC) that includes (i) a plurality of segments, wherein each of the plurality of segments outputs a respective output and (ii) a plurality of drivers, wherein each of the plurality of drivers receives a respective one of the plurality of clock signals and provides a driver signal to a respective one of the plurality of segments based on the respective one of the plurality of clock signals.

2. The system of claim 1, wherein the clock interconnect network includes a loop-shaped line having a controlled impedance.

3. The system of claim 2, wherein the clock interconnect network receives the clock input via a matched impedance selected based on the controlled impedance of the loop-shaped line.

4. The system of claim 2, wherein the input node is arranged in a bottom portion of the loop-shaped line and the plurality of output nodes are arranged in a top portion of the loop-shaped line opposite the input node.

5. The system of claim 2, wherein a first clock signal and a second clock signal propagate from the input node in respective opposite directions around the loop-shaped line.

6. The system of claim 5, wherein each of the plurality of clock signals corresponds to an overlap of the first clock signal and the second clock signal.

7. The system of claim 5, wherein an average propagation delay of respective waves of the first clock signal and the second clock signal at each of the plurality of output nodes is independent of respective positions of the plurality of output nodes on the loop-shaped line.

8. The system of claim 7, wherein the average propagation delay is approximately half of a propagation delay of the loop-shaped line.

9. The system of claim 1, further comprising an output interconnect network that receives a plurality of outputs of the DAC, wherein the plurality of outputs includes respective positive and negative outputs of the DAC, and generates a differential output signal based on the respective positive and negative outputs.

10. The system of claim 9, wherein the output interconnect network includes a first transmission loop connected to the respective positive outputs and a second transmission loop connected to the respective negative outputs.

11. A method comprising:
receiving a clock input at an input node;
distributing, based on the clock input, a plurality of clock signals via respective ones of a plurality of output nodes, wherein a propagation delay of each of the distributed plurality of clock signals is approximately equal to respective propagation delays of others of the distributed plurality of clock signals;
receiving, at each of a plurality of drivers, a respective one of the plurality of clock signals;
providing, from each of the plurality of drivers, a driver signal to a respective one of a plurality of segments of a digital-to-analog converter (DAC) based on the respective one of the plurality of clock signals, wherein each of the plurality of segments outputs a respective output based on the driver signal.

12. The method of claim 11, further comprising providing a loop-shaped line having a controlled impedance, wherein the input node and the plurality of output nodes are arranged in respective positions along the loop-shaped line.

13. The method of claim 12, wherein receiving the clock input includes receiving the clock input via a matched impedance selected based on the controlled impedance of the loop-shaped line.

14. The method of claim 12, wherein the input node is arranged in a bottom portion of the loop-shaped line and the plurality of output nodes are arranged in a top portion of the loop-shaped line opposite the input node.

15. The method of claim 12, wherein distributing the plurality of clock signals includes propagating a first clock signal and a second clock signal from the input node in respective opposite directions around the loop-shaped line.

16. The method of claim 15, wherein each of the plurality of clock signals corresponds to an overlap of the first clock signal and the second clock signal.

17. The method of claim 15, wherein an average propagation delay of respective waves of the first clock signal and the second clock signal at each of the plurality of output nodes is independent of respective positions of the plurality of output nodes on the loop-shaped line.

18. The method of claim 11, further comprising receiving a plurality of outputs of the DAC, wherein the plurality of outputs includes respective positive and negative outputs of the DAC, and generating a differential output signal based on the respective positive and negative outputs.

19. The method of claim 18, wherein receiving the plurality of outputs of the DAC includes receiving the respective positive outputs at a first transmission loop and receiving the respective negative outputs at a second transmission loop.

20. A system comprising:
- a clock interconnect network including an input node and a plurality of output nodes arranged around a loop-shaped line, wherein the clock interconnect network receives a clock input at the input node and distributes, based on the clock input, a plurality of clock signals to respective drivers of a digital-to-analog converter (DAC) via respective ones of the plurality of output nodes, and wherein a propagation delay of each of the plurality of clock signals distributed by the clock interconnect network is approximately equal to respective propagation delays of others of the plurality of clock signals distributed by the clock interconnect network; and
- an output interconnect network that (i) receives a plurality of outputs of the DAC, wherein the plurality of outputs includes respective positive and negative outputs of the DAC, and wherein the output interconnect network includes a first transmission loop connected to the respective positive outputs and a second transmission loop connected to the respective negative outputs, and (ii) generates a differential output signal based on the respective positive and negative outputs.

* * * * *